United States Patent
Zhang

(10) Patent No.: US 11,289,605 B2
(45) Date of Patent: Mar. 29, 2022

(54) THIN FILM TRANSISTOR SUBSTRATE AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Qianyi Zhang, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 162 days.

(21) Appl. No.: 16/624,206

(22) PCT Filed: Jul. 11, 2019

(86) PCT No.: PCT/CN2019/116129
§ 371 (c)(1),
(2) Date: Dec. 18, 2019

(87) PCT Pub. No.: WO2020/238030
PCT Pub. Date: Dec. 3, 2020

(65) Prior Publication Data
US 2021/0296504 A1    Sep. 23, 2021

(30) Foreign Application Priority Data
May 28, 2019 (CN) .......... 201910449049.8

(51) Int. Cl.
H01L 29/00 (2006.01)
H01L 29/786 (2006.01)
H01L 29/66 (2006.01)

(52) U.S. Cl.
CPC .. *H01L 29/78618* (2013.01); *H01L 29/66742* (2013.01); *H01L 29/7869* (2013.01)

(58) Field of Classification Search
CPC ......... H01L 29/78618; H01L 29/66742; H01L 29/7869
See application file for complete search history.

(56) References Cited

U.S. PATENT DOCUMENTS 8,164,152 B2 * 4/2012 Lee ................... G02F 1/1368
257/442
8,338,827 B2 * 12/2012 Yamazaki ......... H01L 29/66969
257/43

(Continued)

FOREIGN PATENT DOCUMENTS

CN    1979912 A    8/2007
CN   101614917 A   12/2009

(Continued)

*Primary Examiner* — Nikolay K Yushin
(74) *Attorney, Agent, or Firm* — Berger Singerman LLP; Geoffrey Lottenberg

(57) ABSTRACT

A thin film transistor substrate and its manufacturing method are provided. The thin film transistor substrate avoids semiconductor defects caused by acid corrosion of a metal oxide channel during an etching process of forming a source/drain electrode, and effectively prevents copper from diffusing downward into the metal oxide channel under high temperature conditions. Such configuration eliminates a need to additionally use a barrier material, reduces production costs, and prevents short-circuiting resulting from a residual barrier material.

5 Claims, 5 Drawing Sheets

(56) References Cited

U.S. PATENT DOCUMENTS

| | | | |
|---|---|---|---|
| 8,569,754 B2* | 10/2013 | Yamazaki | H01L 29/45 |
| | | | 257/43 |
| 9,112,040 B2* | 8/2015 | Liu | H01L 21/467 |
| 9,515,093 B2* | 12/2016 | Xun | H01L 29/66765 |
| 9,812,581 B2* | 11/2017 | Kitakado | H01L 29/78633 |
| 2007/0131926 A1 | 6/2007 | Lee et al. | |
| 2009/0321740 A1 | 12/2009 | Xiao | |
| 2010/0051935 A1* | 3/2010 | Lee | G02F 1/136286 |
| | | | 257/43 |
| 2010/0117073 A1* | 5/2010 | Yamazaki | H01L 29/66969 |
| | | | 257/43 |
| 2012/0112184 A1* | 5/2012 | Yamazaki | H01L 29/4908 |
| | | | 257/43 |
| 2012/0248446 A1* | 10/2012 | Liu | H01L 29/66969 |
| | | | 257/59 |
| 2013/0169903 A1 | 7/2013 | Xiao et al. | |
| 2015/0194450 A1 | 7/2015 | Gao | |
| 2015/0200212 A1* | 7/2015 | Xu | H01L 27/124 |
| | | | 257/43 |
| 2015/0318383 A1 | 11/2015 | Liu et al. | |
| 2016/0013325 A1* | 1/2016 | Kitakado | H01L 29/78618 |
| | | | 257/43 |
| 2020/0035709 A1 | 1/2020 | Zhu et al. | |

FOREIGN PATENT DOCUMENTS

| | | |
|---|---|---|
| CN | 101995711 A | 3/2011 |
| CN | 102655165 A | 9/2012 |
| CN | 103236440 A | 8/2013 |
| CN | 106876281 A | 6/2017 |
| CN | 109065551 A | 12/2018 |

* cited by examiner

THIN FILM TRANSISTOR SUBSTRATE AND MANUFACTURING METHOD THEREOF

1. CROSS-REFERENCE TO RELATED PATENTS

This application is the National phase under 35 U.S.C. § 371 of International Application No. PCT/CN2019/116129, filed Nov. 7, 2019, which claims the benefit of and priority to Chinese Patent Application No. 201910449049.8, filed May 28, 2019. The entire contents of these patent applications are hereby incorporated by reference herein.

2. FIELD OF DISCLOSURE

The present invention relates to a field of display panels and in particular, to a thin film transistor substrate and a manufacturing method thereof.

3. DESCRIPTION OF RELATED ART

Liquid crystal displays (LCDs) are the most widely used displays on the market. LCDs have advantages such as high brightness, long lifespan, wide viewing angles, and large-size screens. Manufacturing techniques of LCDs are well developed, and LCDs have high production yields, relatively low production costs, and high market acceptance.

A thin film transistor (TFT) plate is an important part of a liquid crystal display for achieving display. In forming metal oxide in a thin film transistor substrate, carrier mobility of indium gallium zinc oxide (IGZO) is 20 to 30 times that of amorphous silicon, so thin film transistors can charge and discharge pixel electrodes at significant high rate, thus achieving a faster refresh rate and greatly improving pixel row scan rate. However, in a process of manufacturing bottom-gate IGZO, IGZO may be damaged by an etching step due to a selection ratio, which causes defects in surfaces of IGZO, thus leading to current leakage and affecting a threshold voltage and stability.

In addition, in forming a source/drain electrode of the thin film transistor substrate, if the source/drain electrode is made of copper (Cu) which has poor adhesion to an underlay or silicon oxide and silicon nitride, copper may diffuse to channels, and as a result, a barrier material needs to be added additionally. This causes increases costs for etching and also leads to short-circuiting if there are residues of a barrier layer such as a molybdenum (Mo) layer.

Therefore, it is necessary to provide a solution to solve the problems in conventional techniques.

SUMMARY

It is an objective of the present invention to provides a thin film transistor substrate and a manufacturing method thereof, whereby a problem of conventional techniques can be solved.

Accordingly, the present invention provides a thin film transistor substrate, comprising:
an underlay;
a gate electrode layer disposed on the underlay;
a gate insulating layer disposed on the gate electrode layer;
a metal oxide layer disposed on the gate insulating layer; and
a source/drain electrode disposed on two ends of the metal oxide layer, the source/drain electrode comprising a stacked structure constituted by a first metal layer and a second metal layer stacked on each other, wherein the first metal layer is disposed on the second metal layer.

According to one embodiment of the present invention, the gate electrode layer is a laminated structure, and the laminated structure is made of copper and molybdenum.

According to one embodiment of the present invention, the gate insulating layer covers surfaces of the gate electrode layer and the underlay, and the metal oxide layer is made of indium gallium zinc oxide (IGZO).

According to one embodiment of the present invention, the first metal layer is made of copper, and the second metal layer is made of indium tin oxide.

According to one embodiment of the present invention, the thin film transistor substrate further comprises a passivation layer disposed on the source/drain electrode, wherein the passivation layer covers surfaces of the gate insulating layer, the source/drain electrode, and the metal oxide layer.

Accordingly, the present invention provides a thin film transistor substrate, comprising:
an underlay;
a gate electrode layer disposed on the underlay, wherein the gate electrode layer is a laminated structure consisting of copper and molybdenum;
a gate insulating layer disposed on the gate electrode layer;
a metal oxide layer disposed on the gate insulating layer;
a source/drain electrode disposed on two ends of the metal oxide layer, the source/drain electrode comprising a stacked structure constituted by a first metal layer and a second metal layer stacked on each other, wherein the first metal layer is disposed on the second metal layer; and
a passivation layer disposed on the source/drain electrode, the passivation layer covering surfaces of the gate insulating layer, the source/drain electrode, and the metal oxide layer.

According to one embodiment of the present invention, the gate insulating layer covers surfaces of the gate electrode layer and the underlay, and the metal oxide layer is made of indium gallium zinc oxide (IGZO).

According to one embodiment of the present invention, the first metal layer is made of copper, and the second metal layer is made of indium tin oxide.

Accordingly, the present invention provides a manufacturing method of a thin film transistor substrate, comprising following steps:
step S1: providing an underlay;
step S2: forming a gate electrode layer on the underlay;
step S3: forming a gate insulating layer on the gate electrode layer;
step S4: forming a metal oxide layer on the gate insulating layer;
step S5: forming a photoresist layer on the metal oxide layer;
step S6: ashing the photoresist layer to define an opening in a region of the metal oxide layer where a source/drain electrode is to be formed;
step S7: forming a metal layer on the photoresist layer and in the opening, wherein the metal layer comprises a first metal layer and a second metal layer stacked on each other, and the first metal layer is disposed on the second metal layer; and
step S8: stripping off the metal layer covering the photoresist layer and stripping off the photoresist layer, wherein the metal layer remaining in the opening serves as the source/drain electrode.

According to one embodiment of the present invention, step S2 comprises:

forming the gate electrode layer by physical vapor deposition, wherein the gate electrode layer is a laminated structure made of copper and molybdenum; and performing a photolithography process on the gate electrode layer and then forming a gate electrode pattern by wet etching.

According to one embodiment of the present invention, the gate insulating layer is formed by chemical vapor deposition, the gate insulating layer covers surfaces of the gate electrode layer and the underlay, the metal oxide layer is formed by physical vapor deposition, and the metal oxide layer is made of indium gallium zinc oxide (IGZO).

According to one embodiment of the present invention, the first metal layer is made of copper, and the second metal layer is made of indium tin oxide.

According to one embodiment of the present invention, the manufacturing method further comprises following steps after step S8:

S9: forming a passivation layer on the source/drain electrode, wherein the passivation layer covers surfaces of the gate insulating layer, the source/drain electrode, and the metal oxide layer.

Advantages of the Present Invention

Compared with conventional techniques, in the thin film transistor substrate and the manufacturing method of the thin film transistor of the present invention, the source/drain electrode is formed by stripping instead of etching, thereby avoiding a problem that a channel of metal oxide is corroded by an etching process of forming the source/drain electrode to cause semiconductor defects which lead to current leakage and affects threshold voltage and stability. The source/drain electrode uses a stacked structure consisting of copper and indium tin oxide, and after patterning, copper is positioned on a surface of indium tin oxide, thereby effectively preventing copper from diffusing downward into a metal oxide channel under high temperature conditions; The stacked structure made of copper and indium tin oxide eliminates a need of use of an additional barrier material, reduces production costs, and reduces a risk of short-circuiting resulting from a residual barrier material.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

The following description is provided with reference to the accompanying drawings to illustrate various embodiments of the present disclosure.

FIGS. 1 to 12 illustrate a thin film transistor substrate and a manufacturing method thereof according to the present invention.

Figure 1:
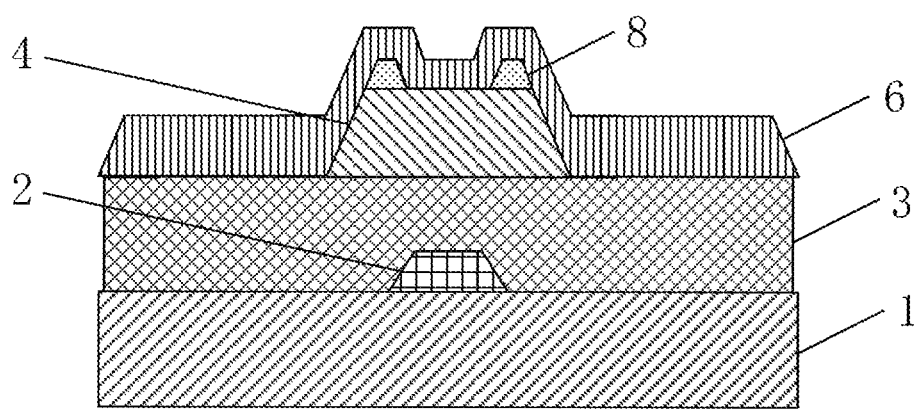
FIG. 1 is a schematic structural view illustrating a thin film transistor substrate according to one embodiment of the present invention.

The present invention provides a thin film transistor substrate. FIG. 1 is a schematic structural view illustrating the thin film transistor substrate according to one embodiment of the present invention. The thin film transistor substrate comprises an underlay 1, a gate electrode layer 2, a gate insulating layer 3, a metal oxide layer 4, a source/drain electrode 5, and a passivation layer 6.

Figure 3:
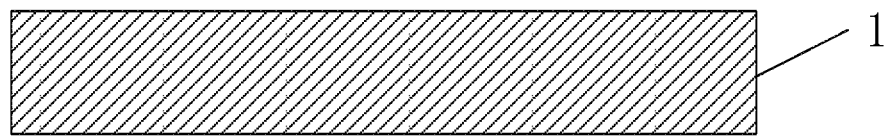
FIG. 3 is schematic structural view illustrating step S1 of FIG. 2.

As shown in FIG. 3, the underlay 1 serves as a bottom of the thin film transistor substrate. The underlay 1 is a glass plate; however, the present invention is not limited in this regard.

Figure 4:
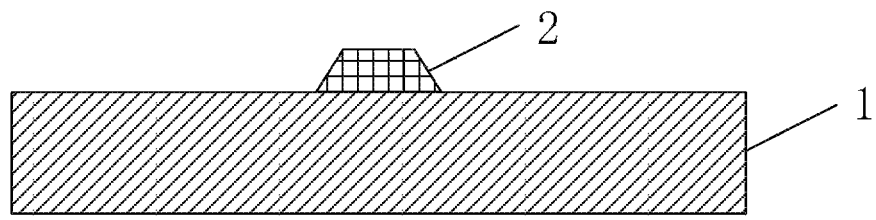
FIG. 4 is a schematic structural view illustrating step S2 of FIG. 2.

As shown in FIG. 4, the gate electrode layer 2 is disposed on the underlay 1. In the present embodiment, the gate electrode layer 2 is preferably formed at the middle of the underlay 1. The gate electrode layer 2 is formed by physical vapor deposition. The gate electrode layer 2 is a laminated structure made of copper and molybdenum. In the present embodiment, it is preferable that, the laminated structure of the gate electrode layer 2 comprises a copper film disposed on a molybdenum film. A thickness of the copper film is, for example, but not limited to, 400 nm to 820 nm. The copper film functions as a good conductive wire. A thickness of the molybdenum film is, for example, but not limited to, 20 nm to 45 nm. The molybdenum film can serve as a barrier and also improve adhesion of the underlay 1 to the copper film.

Figure 5:
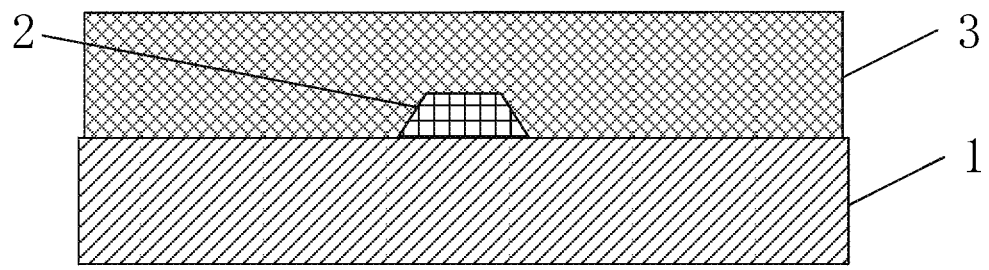
FIG. 5 is a schematic structural view illustrating step S3 of FIG. 2.

As shown in FIG. 5, the gate insulating layer 3 is disposed on the gate electrode layer 2. In the present embodiment, the gate insulating layer 3 preferably covers surfaces of the underlay 1 and the gate electrode layer 2. The gate insulating layer 3 is formed by chemical vapor deposition.

Figure 6:
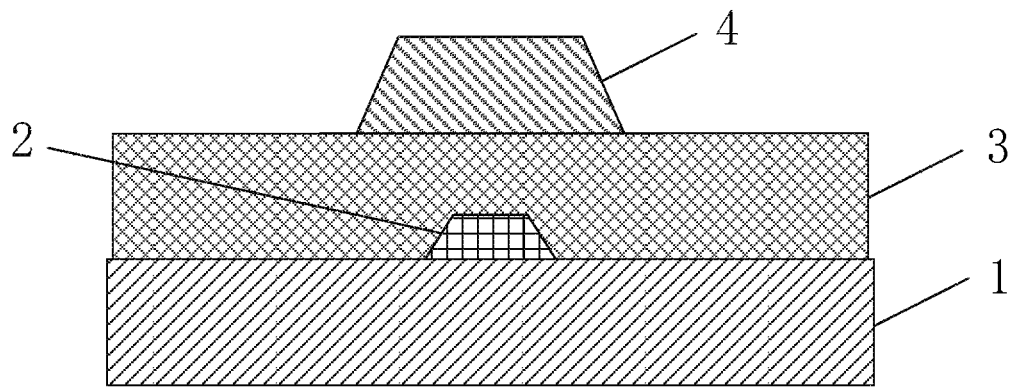
FIG. 6 is a schematic structural view illustrating step S4 of FIG. 2.

As shown in FIG. 6, a metal oxide layer 4 is disposed on the gate insulating layer 3. In the present embodiment, it is preferable that, the metal oxide layer 4 is formed at the middle of the gate insulating layer 3. The metal oxide layer 4 is formed by physical vapor deposition. The metal oxide layer 4 is made of, for example, but not limited to, indium gallium zinc oxide (IGZO). The metal oxide layer 4 serves as a semiconductor layer.

Figure 7:
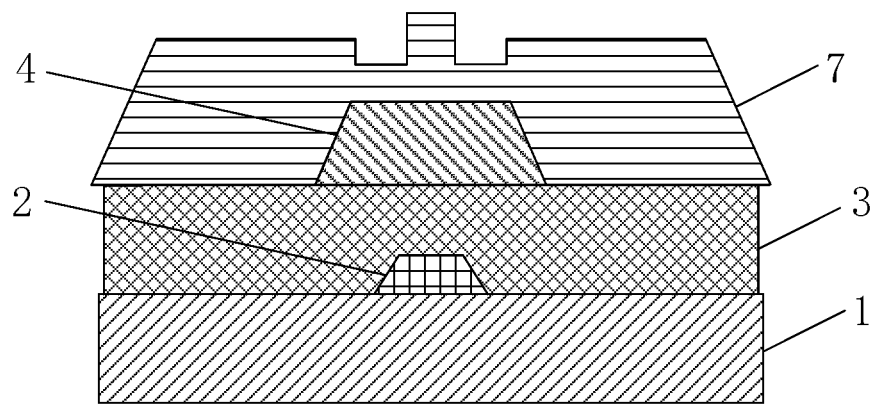
FIG. 7 is a schematic structural view illustrating step S5 of FIG. 2.
Figure 8:
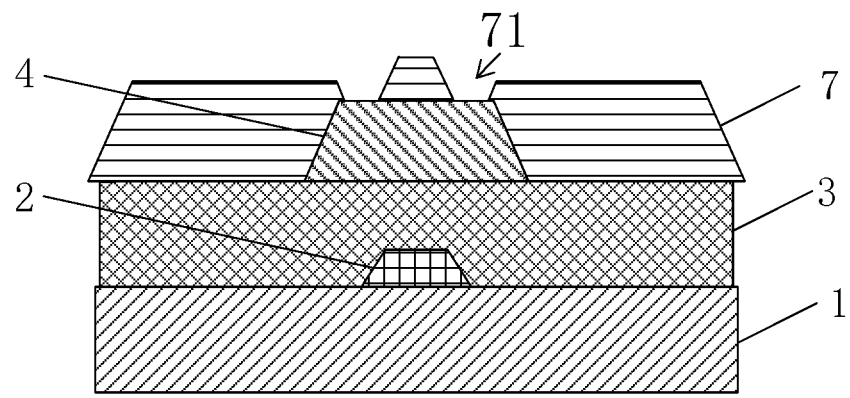
FIG. 8 is a schematic structural view illustrating step S6 of FIG. 2.
Figure 9:
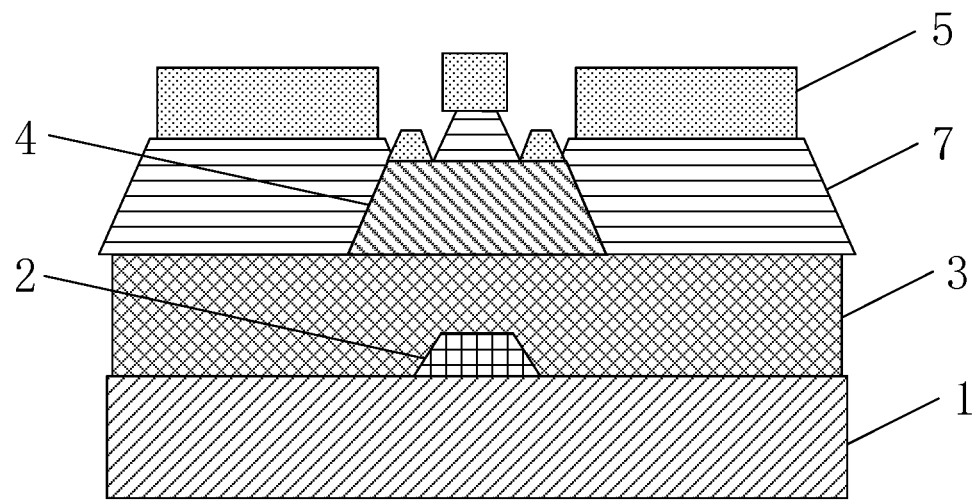
FIG. 9 is a schematic structural view illustrating step S7 of FIG. 2.

As shown in FIG. 7, the metal oxide layer 4 is patterned to form a pattern of the metal oxide layer 4. Thereafter, the metal oxide layer 4 is baked and then developed by using a yellow halftone mask to obtain a photoresist layer 7 with different heights, so that the photoresist layer 7 is thinner in a region where the metal oxide layer 4 is in contact with the source/drain electrode 5. As shown in FIGS. 8 and 9, after development, the photoresist layer 7 with height differences are modified and ashed by dry etching, so that the photoresist layer 7 is not present in a region where the metal oxide layer 4 is in contact with the source/drain electrode 5, but the photoresist layer 7 is present in a region where the metal oxide layer 4 is not in contact with the source/drain electrode 5. The photoresist layer 7 in the region where the metal oxide layer 4 is not in contact with the source/drain electrode 5 is arranged at an angle for better stripping of the photoresist layer 7. Preferably, the angle ranges from 30 degrees to 65 degrees in the present embodiment.

As shown in FIG. 9, the source/drain electrode 5 comprises a source electrode and a drain electrode which are respectively formed on two ends of the metal oxide layer 4. Also referring to FIG. 10, the source/drain electrode 5 has a stacked structure. Preferably, in the embodiment, as shown in FIG. 8, the stacked structure of the source/drain electrode 5 is a two-layer structure including a first metal layer 501 and a second metal layer 502. The metal layer 501 is made of copper, and the second metal layer 502 is made of indium tin oxide. Preferably, in the present embodiment, a thickness of the first metal layer 501 is, for example, but not limited to, 400 nm to 820 nm, and the first metal layer 501 functions as a good conductive wire. A thickness of the second metal layer 502 is, for example, but not limited to, 20 nm to 45 nm, and the second metal layer 502 can serve as a barrier. The first metal layer 501 is disposed on the second metal layer 502. Since the second metal layer 502 is indium tin oxide and can function normally under high temperature conditions, such configuration can effectively prevent copper from diffusing downward to the metal oxide layer 4 at high temperatures. Consequently, it is not necessary to additionally add a barrier material to prevent copper from diffusing downward under high temperature conditions, thereby reducing production costs and also preventing short-circuiting caused by residues of a barrier material like a molybdenum layer.

Figure 11:
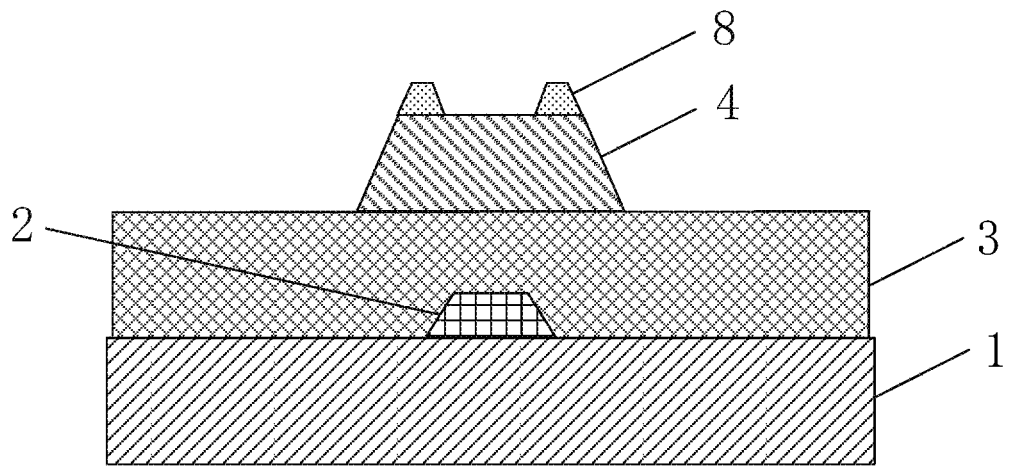
FIG. 11 is a schematic structural view illustrating step S8 of FIG. 2.

Referring to FIG. 11, the source/drain electrode 5 is directly deposited on the metal oxide layer 4. After the layers of the source/drain electrode 5 are deposited, the remaining photoresist layer 7 is directly stripped off to form a channel 4, a source/drain electrode 8, and a pattern. The source/drain electrode 8 is formed by stripping, thereby avoiding a problem that the channel of the metal oxide layer 4 channel is corroded by acid from the conventional etching process to cause semiconductor defects.

Figure 12:
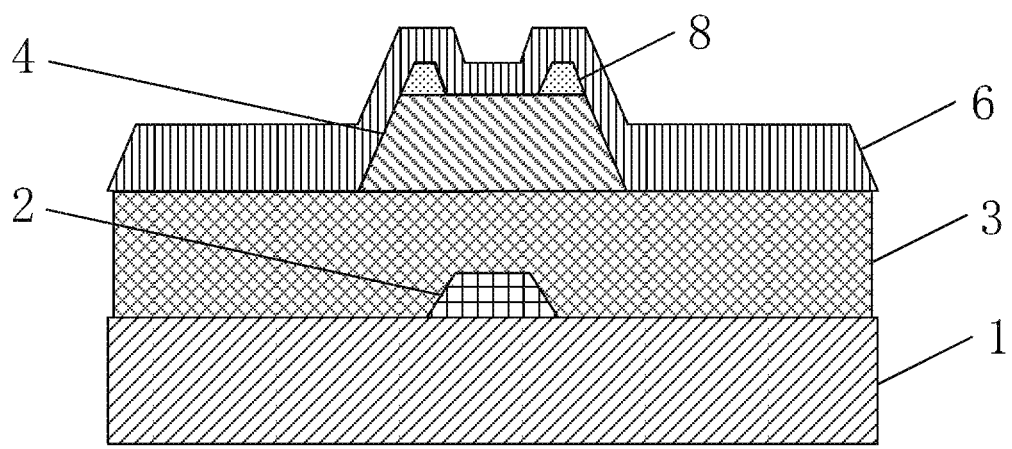
FIG. 12 is a schematic structural view illustrating step S9 performed after step S8 of FIG. 11.

Referring to FIG. 12, a passivation layer 6 is formed on the source/drain electrode 8 and covers surfaces of the gate insulating layer 3, the metal oxide layer 4, and the source/drain electrode 5. The passivation layer 6 is used to block water and oxygen to prolong a lifespan of the thin film transistor substrate.

Figure 2:
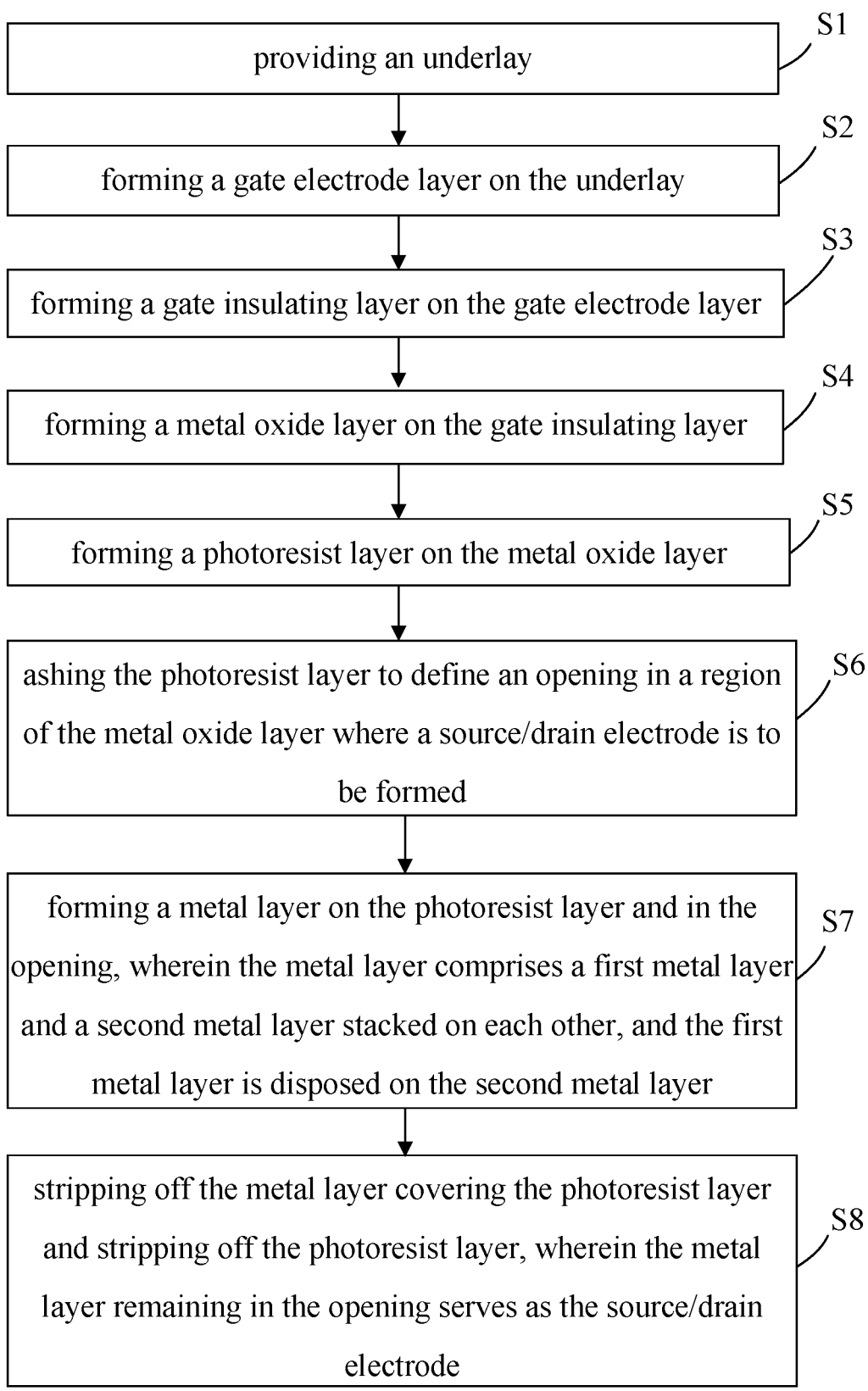
FIG. 2 is a process flow diagram illustrating a manufacturing method of the thin film transistor substrate according to one embodiment of the present invention.

The present invention provides a manufacturing method of a thin film transistor substrate. FIG. 2 is a process flow diagram illustrating the manufacturing method of the thin film transistor substrate according to one embodiment of the present invention, comprising steps as follows.

step S1: providing an underlay 1.

As shown in FIG. 3, the underlay 1 is provided as a bottom of the thin film transistor substrate. The underlay 1 is, for example, but not limited to, a glass plate.

step S2: forming a gate electrode layer 2 on the underlay 1.

As shown in FIG. 4, the gate electrode layer 2 is deposited on a surface of the underlay 1 by a physical vapor deposition (PVD) process. In present embodiment, the gate electrode layer 2 is preferably formed at the middle of the underlay 1 and has a trapezoidal shape. The gate electrode layer 2 comprises a laminated structure made of a copper film and a molybdenum film stacked on each other. In the present embodiment, the copper film is preferably disposed on the molybdenum film. A thickness of the copper film is, for example, but not limited to, 400 nm to 820 nm, and the copper film functions as a good conductive wire. A thickness of the molybdenum film is, for example, but not limited to, 20 nm to 45 nm, and the molybdenum film serves as a barrier while improving adhesion of the underlay 1 to the copper film.

step S3: forming a gate insulating layer 3 on the gate electrode layer 2.

As shown in FIG. 5, the gate insulating layer 3 is deposited on a surface of the gate electrode layer 2 by a chemical vapor deposition (CVD) process. Preferably, in the present embodiment, the gate insulating layer 3 covers the upper surfaces of the underlay 1 and the gate electrode layer 2.

step S4: forming a metal oxide layer 4 on the gate insulating layer 3;

As shown in FIG. 6, the metal oxide layer 4 is deposited on a surface of the gate insulating layer 3 by physical vapor deposition. Preferably, in the present embodiment, the metal oxide layer 4 is formed at the middle of the gate insulating layer 3 and has a trapezoidal shape. The metal oxide layer 4 is made of, for example, but not limited to, indium gallium zinc oxide (IGZO). The metal oxide layer 4 serves as a semiconductor layer. IGZO enables the thin film transistor substrate to charge and discharge pixel electrodes at higher speeds, achieves a faster refresh rate, and improves a pixel row scan rate. After that, a photolithography process is performed, and after etching, a remaining photoresist layer 7 on surfaces is stripped off.

step S5: forming a photoresist layer 7 on the metal oxide layer 4.

As shown in FIG. 7, after the metal oxide layer 4 is patterned, the metal oxide layer 4 is baked and then developed by using a yellow halftone mask to obtain the photoresist layer 7 having different heights. A region of the photoresist layer 7, where the source/drain electrode 8 is to be formed on the metal oxide layer 4, is thinner than other regions of the photoresist layer 7.

step S6: ashing the photoresist layer 7 to define an opening in a region of the metal oxide layer 4 where the source/drain electrode 8 is to be formed.

As shown in FIG. 8, after development, the photoresist layer 7 with different heights is modified and ashed by dry etching, so that the photoresist layer 7 is not present in a region where the source/drain electrode 8 is to be formed on the metal oxide layer 4, and the photoresist layer 7 is present on the oxide layer 4 excluding the region where the source/drain electrode 8 is to be formed. An opening 71 is defined because the photoresist layer 7 is not present in a position where the source/drain electrode 8 is to be formed on the metal oxide layer 4. For better stripping of the photoresist layer 7. The metal oxide layer 4 is at a specific angle, and so is the photoresist layer 7 except a region where the source/drain electrode 8 is to be formed. In the present embodiment, the specific angle ranges from 30 degrees to 65 degrees.

step S7: forming a metal layer 5 on the photoresist layer 7 and in the opening, wherein the metal layer 5 comprising a first metal layer 501 and a second metal layer 502 stacked on each other, and the first metal layer 501 is disposed on the second metal layer 502.

As shown in FIG. 9, the metal layer 5 is formed on the photoresist layer 7 and in the opening. The metal layer 5 covers the photoresist layer 7 and the opening at the same time. In the present embodiment, the metal layer 5 preferably has multiple sections disposed on the photoresist layer 7 and above the opening.

Figure 10:
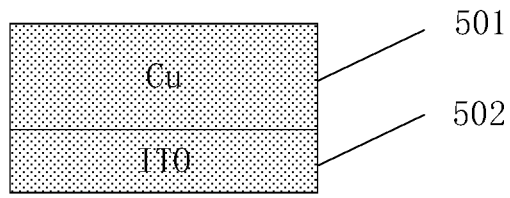
FIG. 10 is a schematic structural view illustrating step S7 of FIG. 2.

As shown in FIG. 10, the metal layer 5 has a two-layer stacked structure comprising the first metal layer 501 and the second metal layer 502. The first metal layer 501 is made of copper, and the second metal layer 502 is made of indium tin oxide. In the present embodiment, it is preferable that, a thickness of the first metal layer 501 is, for example, but not limited to, 400 nm to 820 nm, and the first metal layer 501 functions as a good conductive wire. A thickness of the second metal layer 502 is, for example, but not limited to, 20 nm to 45 nm, and serves as a barrier. The first metal layer 501 is disposed above the second metal layer 502. Since the second metal layer 502 is made of indium tin oxide, such a structure can effectively prevent copper from diffusing downward to the metal oxide layer 4 at high temperatures. As a result, it is not necessary to additionally add a barrier material to block copper from diffusing downward under high temperature conditions, thereby reducing production costs and avoids short-circuiting caused by residues of a barrier material such as molybdenum.

step S8: stripping off the metal layer 5 covering the photoresist layer 7 thereunder and stripping off the photoresist layer 7, wherein the metal layer 5 remaining in the opening serves as the source/drain electrode 8.

As shown in FIG. 11, after the metal layer 5 is deposited, stripping is performed. The metal layer 5 covering the photoresist layer 7 is stripped off, the remaining photoresist layer 7 is directly stripped off, and only the metal layer 5 in the opening remains. The remaining metal layer 5 in the opening forms the source/drain electrode 8, and then a channel and a source/drain pattern are formed. The source/drain electrode 8 formed by stripping avoids a problem that a channel of the metal oxide layer 4 is corroded by acids from using the conventional etching process to cause semiconductor defects.

The source/drain electrode 8 comprises a source electrode and a drain electrode formed in the opening, that is, formed on the metal oxide layer 4. Preferably, in the present embodiment, the source electrode and drain electrode of the source/drain electrode 8 are deposited on two ends of the metal oxide layer 4, respectively. Since the source/drain electrode 8 is the metal layers 5 in the opening, the source/drain electrode 8 has the same structure and properties as the metal layer 5. Since the structure and properties of the metal layer 5 have been described above, a description thereof is not repeated herein for brevity.

According to another embodiment of the present invention, the manufacturing method of the thin film transistor substrate further comprises following steps after step S8.

step S9: forming a passivation layer 6 on the source/drain electrode 8.

As shown in FIG. 12, the passivation layer 6 is deposited, and then annealed. The passivation layer 6 at the same time covers surfaces of the gate insulating layer 3, the metal oxide layer 4, and the source/drain electrode 8. Preferably, in the present embodiment, the passivation layer 6 covers the surfaces of the gate insulating layer 3, the metal oxide layer 4, and the source/drain electrode 8. The passivation layer 6 is used to block water and oxygen and prolongs a lifespan of the thin film transistor substrate.

In the thin film transistor substrate and the manufacturing method thereof, the source/drain electrode is formed by stripping instead of etching, thereby preventing semiconductor defects which lead to current leakage and affect threshold voltage and stability from being caused by acid corrosion of the metal oxide channel during a conventional etching process of forming the source electrode and the drain electrode. The source/drain electrode uses a stacked structure consisting of copper and indium tin oxide, and after patterning, copper is positioned on a surface of indium tin oxide, thereby effectively preventing copper from diffusing downward into a metal oxide channel under high temperature conditions; The stacked structure consisting of copper and indium tin oxide eliminates a need for using an additional barrier material, reduces production costs, and avoids short-circuiting resulting from a residual barrier material.

Although the present disclosure has been disclosed in the above embodiments, the above embodiments are not intended to limit the present disclosure, and those skilled in the art can make various modifications without departing from the spirit and scope of the present disclosure. The protection scope of the present disclosure is determined by the scope defined by the appended claims.

What is claimed is:

1. A manufacturing method of a thin film transistor substrate, comprising following steps:
   step S1: providing an underlay;
   step S2: forming a gate electrode layer on the underlay;
   step S3: forming a gate insulating layer on the gate electrode layer;
   step S4: forming a metal oxide layer on the gate insulating layer;
   step S5: forming a photoresist layer on the metal oxide layer;
   step S6: ashing the photoresist layer to define an opening in a region of the metal oxide layer where a source/drain electrode is to be formed;
   step S7: forming a metal layer on the photoresist layer and in the opening, wherein the metal layer comprises a first metal layer and a second metal layer stacked on each other, and the first metal layer is disposed on the second metal layer; and
   step S8: stripping off the metal layer covering the photoresist layer and stripping off the photoresist layer, wherein the metal layer remaining in the opening serves as the source/drain electrode.

2. The manufacturing method of the thin film transistor substrate according to claim 1, wherein step S2 comprises:
   forming the gate electrode layer by physical vapor deposition, wherein the gate electrode layer is a laminated structure made of copper and molybdenum; and
   performing a photolithography process on the gate electrode layer and then forming a gate electrode pattern by wet etching.

3. The manufacturing method of the thin film transistor substrate according to claim 1, wherein the gate insulating layer is formed by chemical vapor deposition, the gate insulating layer covers surfaces of the gate electrode layer and the underlay, the metal oxide layer is formed by physical vapor deposition, and the metal oxide layer is made of indium gallium zinc oxide (IGZO).

4. The manufacturing method of the thin film transistor substrate according to claim 1, wherein the first metal layer is made of copper, and the second metal layer is made of indium tin oxide.

5. The manufacturing method of the thin film transistor substrate according to claim 4, wherein after step S8, the manufacturing method further comprises following steps:

S9: forming a passivation layer on the source/drain electrode, wherein the passivation layer covers surfaces of the gate insulating layer, the source/drain electrode, and the metal oxide layer.

* * * * *